United States Patent
Abel et al.

(10) Patent No.: US 10,447,006 B2
(45) Date of Patent: Oct. 15, 2019

(54) ELECTRO-OPTICAL DEVICE WITH ASYMMETRIC, VERTICAL CURRENT INJECTION OHMIC CONTACTS

(71) Applicant: International Business Machines Corporation, Armonk, NY (US)

(72) Inventors: Stefan Abel, Zurich (CH); Lukas Czornomaz, Zurich (CH); Jean Fompeyrine, Waedenswil (CH); Utz Herwig Hahn, Zurich (CH); Folkert Horst, Wettingen (CH); Marc Seifried, Zurich (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 19 days.

(21) Appl. No.: 15/439,425

(22) Filed: Feb. 22, 2017

(65) Prior Publication Data

US 2018/0241176 A1    Aug. 23, 2018

(51) Int. Cl.
*H01S 5/026* (2006.01)
*H01S 3/063* (2006.01)
(Continued)

(52) U.S. Cl.
CPC ............ *H01S 5/026* (2013.01); *H01S 3/0637* (2013.01); *H01S 3/2375* (2013.01);
(Continued)

(58) Field of Classification Search
CPC ...... H01S 5/0421; H01S 3/0637; H01S 5/026; H01S 5/0425; H01S 5/2031;
(Continued)

(56) References Cited

U.S. PATENT DOCUMENTS

| 5,488,504 A | 1/1996 | Worchesky et al. |
| 6,180,429 B1 * | 1/2001 | Anselm ............... H01L 21/0331 |
| | | 257/E21.034 |

(Continued)

FOREIGN PATENT DOCUMENTS

GB    1319207.5    * 10/2014    ........... G02B 6/4286

OTHER PUBLICATIONS

Lin et al., "Design and fabrication of a InGaN vertical-cavity surface-emitting laser with a composition-graded electron-blocking layer," Laser Physics Letters, vol. 11, No. 8, 2014, 5 pages.

*Primary Examiner* — Yuanda Zhang
(74) *Attorney, Agent, or Firm* — Cantor Colburn LLP; Daniel Morris

(57) ABSTRACT

The present invention is notably directed to an electro-optical device. This device has a layer structure, which comprises a stack of III-V semiconductor gain materials, an n-doped layer and a p-doped layer. The III-V materials are stacked along a stacking direction z, which is perpendicular to a main plane of the stack. The n-doped layer extends essentially parallel to the main plane of the stack, on one side thereof. The p-doped layer too extends essentially parallel to this main plane, but on another side thereof. A median vertical plane can be defined in the layer structure, which plane is parallel to the stacking direction z and perpendicular to the main plane of the stack. Now, the device further comprises two sets of ohmic contacts, wherein the ohmic contacts of each set are configured for vertical current injection in the stack of III-V semiconductor gain materials.

22 Claims, 4 Drawing Sheets

(51) Int. Cl.
*H01S 3/23* (2006.01)
*H01S 5/10* (2006.01)
*H01S 5/20* (2006.01)
*H01S 5/042* (2006.01)
*H01S 5/02* (2006.01)
*H01S 5/227* (2006.01)
*H01S 5/22* (2006.01)

(52) U.S. Cl.
CPC .......... *H01S 5/0425* (2013.01); *H01S 5/1003* (2013.01); *H01S 5/1032* (2013.01); *H01S 5/2031* (2013.01); *H01S 5/021* (2013.01); *H01S 5/1014* (2013.01); *H01S 5/227* (2013.01); *H01S 5/2224* (2013.01)

(58) Field of Classification Search
CPC .... H01S 5/1003; H01S 5/1014; H01S 3/2375; H01S 5/125; H01S 5/323; H01S 5/223; H01S 5/12
See application file for complete search history.

(56) References Cited

U.S. PATENT DOCUMENTS

| | | | |
|---|---|---|---|
| 8,040,934 B2 | 10/2011 | Masui et al. | |
| 8,257,990 B2 | 9/2012 | Koch | |
| 8,538,221 B1 | 9/2013 | Fang et al. | |
| 9,083,150 B2 | 7/2015 | Yoshida et al. | |
| 2003/0007719 A1* | 1/2003 | Forrest | B82Y 20/00 385/14 |
| 2007/0057249 A1 | 3/2007 | Kim et al. | |
| 2007/0258498 A1* | 11/2007 | Kawahara | B82Y 20/00 372/46.01 |
| 2009/0116523 A1* | 5/2009 | Leem | G02B 6/12004 372/44.01 |
| 2010/0090232 A1* | 4/2010 | Huang | H01L 33/08 257/89 |
| 2010/0189154 A1* | 7/2010 | Makino | G02B 6/12007 372/50.11 |
| 2012/0320939 A1 | 12/2012 | Baets et al. | |
| 2015/0180209 A1 | 6/2015 | Takenaka et al. | |
| 2016/0252692 A1* | 9/2016 | Hofrichter | G02B 6/12004 250/227.11 |
| 2017/0098922 A1* | 4/2017 | Hatori | H04B 10/40 |
| 2017/0214216 A1* | 7/2017 | Dong | H01S 5/1014 |

* cited by examiner

ELECTRO-OPTICAL DEVICE WITH ASYMMETRIC, VERTICAL CURRENT INJECTION OHMIC CONTACTS

BACKGROUND

The invention relates in general to the field of electro-optical and optoelectronic devices with vertical current injection electrodes and, in particular, to devices comprising micro-fabricated lasers (e.g., lateral electric field, vertical current injection lasers), optical detectors and semiconductor optical amplifiers involving a stack of III-V semiconductor gain materials.

For the monolithic integration of III-V optoelectronic devices (e.g., lasers, optical detectors, semiconductor optical amplifiers) on CMOS platforms, shallow III-V stacks are necessary, which are typically less than 500 nm thick. An optical mode typically exploited in such structures is a hybrid mode, meaning that the mode is partially in the III-V stack (where present) and partially in the waveguide underneath. The higher the overlap of the mode with the III-V active region (e.g., comprising multiple quantum wells), the easier the lasing is achieved. In such a configuration, however, one cannot use a simple top electrode covering the whole III-V region, as the large optical absorption caused by the metal electrode would prevent lasing action. A solution to this problem is to spatially separate the top electrode from the optical mode. For edge-emitting lasers, other lasers as used for hybrid configurations, e.g., a distributed Bragg reflector laser or a distributed feedback laser, wherein the mirrors are in the waveguide, this eventually leads to a configuration in which two top ohmic contacts and two bottom ohmic contacts are symmetrically positioned (as in FIG. 1). The current and hence the optical mode may, in such devices, be additionally confined by a current blocking layer.

However, as present inventors have realized, the resulting configuration leads to poor performance. Namely, such a configuration results in a very weak overlap between the gain profile (or recombination zone) and the fundamental mode position, which, in turn, impact the output power and the threshold currents.

SUMMARY

According to some aspects, the present invention is embodied as an electro-optical device. This device has a layer structure, which comprises a stack of III-V semiconductor gain materials, an n-doped layer and a p-doped layer. The III-V materials are stacked along a stacking direction z, which is perpendicular to a main plane of the stack. The n-doped layer extends essentially parallel to the main plane of the stack, on one side thereof. The p-doped layer too extends essentially parallel to this main plane, but on another side thereof. A median vertical plane can be defined in the layer structure, which plane is perpendicular to the main plane of the stack and parallel to the stacking direction z. Now, the device further comprises two sets of ohmic contacts, wherein the ohmic contacts of each set are configured for vertical current injection in the stack of III-V semiconductor gain materials. The two sets consist of: (i) a first set of one or more n-type ohmic contacts, which are in contact with the n-doped layer; and (ii) a second set of one or more p-type ohmic contacts, which are in contact with the p-doped layer. Contrary to prior devices, the two sets are here arranged on respective (i.e., opposite) sides of the median vertical plane.

As a result, the two sets of contacts are asymmetrically arranged with respect to the median vertical plane. Because the two sets contact respective layers on each side of the stack, additional asymmetry results with respect to a median horizontal plane of the structure, as discussed below. Moreover, since the sets of ohmic contacts are asymmetric, the electrodes adjoining such ohmic contacts will also have an asymmetric configuration.

As present Inventors have realized, using an asymmetric electrode configuration makes it possible to shape the electric field such as for it to be laterally more homogeneous, compared with an electric field as obtained with a symmetric electrode arrangement. This allows an improved overlap between the recombination zone of electrons and holes and the fundamental mode position. As a result, a proper design of balanced electron and hole injection can be achieved, while keeping the recombination center in the mode region. Eventually, this approach allows a substantially higher output power and lower threshold currents, despite an increase of the access resistances.

In embodiments, in addition to being on respective sides of the median vertical plane, the two sets of ohmic contacts may further be arranged on respective (i.e., opposite) sides of a median horizontal plane of the layer structure, wherein the median horizontal plane is perpendicular to each of the stacking direction z and the median vertical plane. This assumes that shallow contacts are used, which allow shallow stacks to be obtained, to favor their integration.

Each of the two sets of ohmic contacts can include one ohmic contact only, whereby the device comprises two ohmic contacts arranged on respective sides of the median vertical plane (and typically on respective sides of the median horizontal plane too). That is, only two (asymmetric) ohmic contacts are necessary, contrary to (symmetric or substantially symmetric) four-electrode arrangements as commonly done in the art.

In some embodiments, the stack of III-V semiconductor gain materials is laterally embedded in a current blocking layer, the latter extending essentially parallel to the main plane of the stack.

The layer structure can further comprises an electron blocking layer extending parallel to the main plane of the stack of III-V semiconductor gain materials, so as to separate the latter from the p-doped layer.

In embodiments, the stack of III-V semiconductor gain materials comprises two separate confinement heterostructures and an active region sandwiched between said confinement hetero structures.

The stack of III-V semiconductor gain materials can be configured as one of: a laser; an optical detector; and a semiconductor optical amplifier, or SOA.

In embodiments, the electro-optical device is configured as a lateral electric field, vertical current injection laser device or as an edge-emitting laser.

In embodiments, the device may further comprise a tapered waveguide core embedded in a cladding structure, the waveguide core extending opposite and parallel to the stack of III-V semiconductor gain materials with respect to the n-doped layer, along a longitudinal direction that is comprised in the median vertical plane and parallel to the main plane of the stack. The device is configured to optically couple radiation between the stack of III-V semiconductor gain materials and the tapered waveguide core. The device may notably be configured to allow a hybrid-mode optical coupling between an active region of the stack of III-V semiconductor gain materials and the tapered waveguide core.

Thus, and according to another aspect, the invention can be embodied as an electro-optical device comprising a layer structure as described above and, in addition, a tapered waveguide core embedded in a cladding structure, so as to optically couple radiation between the stack of III-V semiconductor gain materials and the tapered waveguide core. Two sets of ohmic contacts can nevertheless be provided on respective sides of the median vertical plane of the layer structure, as described above.

The waveguide core can be structured so as to comprise: an input portion; a middle portion; an output portion; and tapers, the middle portion connected to the input portion and the output portion via the tapers, the latter narrowing inwardly toward the middle portion. The tapers and the middle portion are, altogether, vis-à-vis the stack of III-V semiconductor gain materials, so as to optimize the optical coupling.

In embodiments, the electro-optical device is configured as a distributed Bragg reflector laser. In that case, the optical waveguide core is structured so as to comprise one or more Bragg reflectors arranged in one or each of the input portion and the output portion.

In other embodiments, the present electro-optical devices are configured as a distributed feedback laser, the optical waveguide core being, in that case, structured so as to comprise one or more distributed feedback reflectors arranged in the middle portion of the waveguide core.

In some embodiments, the layer structure of the present electro-optical devices has a form factor, whereby an average dimension of the layer structure in a median horizontal plane thereof is substantially larger than an average dimension of the layer structure in its median vertical plane.

For instance, an average thickness of said stack of III-V semiconductor gain materials can be between 50 nm and 400 nm or, more specifically, can be between 220 nm and 280 nm.

In embodiments, the tapered waveguide core comprises silicon and the cladding structure comprises a material (arranged between the n-doped layer and the tapered waveguide core), which, on the one hand, has a refractive index that is larger than 1.54 for a radiation of interest and, on the other hand, has a bandgap, which, in energy units, is larger than an average energy of said radiation.

In some embodiments, a minimal distance between a lower layer of said stack of III-V semiconductor gain materials and each of the tapered silicon waveguide is between 10 and 1000 nm. This minimal distance may for instance be between 300 and 800 nm or, more specifically, can be between 400 and 600 nm.

According to another aspect, the invention is embodied as an optoelectronic device. The latter comprises an electro-optical device as described above.

In some embodiments, this optoelectronic device further comprises an integrated circuit, or IC, monolithically integrated with said electro-optical device, as a complementary metal oxide semiconductor integrated circuit, or CMOS IC. The optoelectronic device can be a BiCMOS device, and said integrated circuit can comprises a heterostructure bipolar transistor.

Devices embodying the present invention will now be described, by way of non-limiting examples, and in reference to the accompanying drawings.

BRIEF DESCRIPTION OF THE DRAWINGS

FIG. 2 depicts median planes of the layer structure, with ohmic contacts asymmetrically arranged with respect thereto; and FIG. 3 shows details of the layer structure, as in embodiments;

Figure 1:
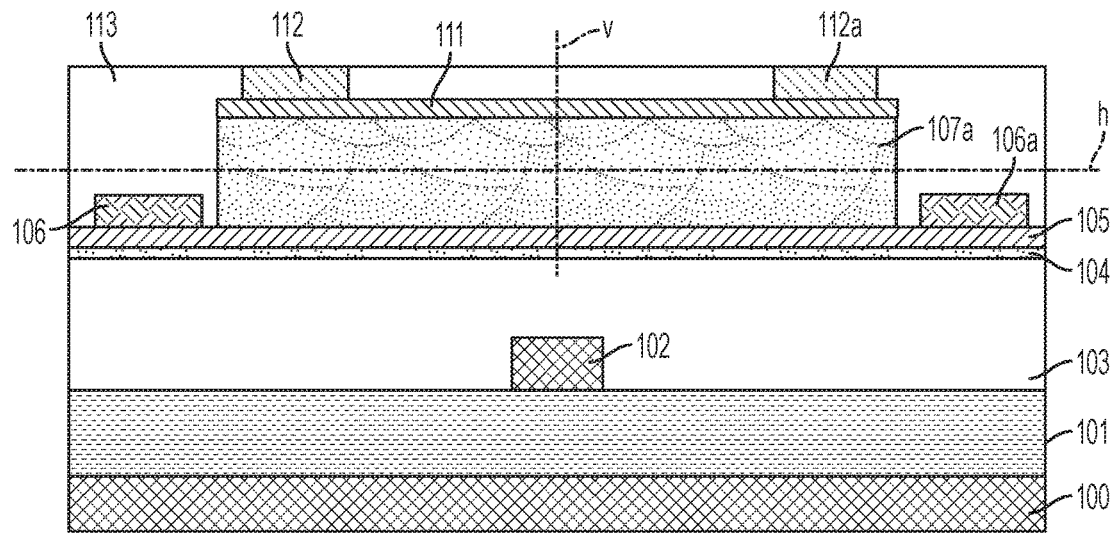
FIG. 1 is a 2D cross-sectional view of an electro-optical device involving a symmetric electrode configuration, as commonly done in the prior art.

The accompanying drawings show simplified representations of devices or parts thereof, as involved in embodiments. Technical features depicted in the drawings are not necessarily to scale and some usual components may be omitted, for conciseness. Similar or functionally similar elements in the figures have been allocated the same numeral references, unless otherwise indicated.

DETAILED DESCRIPTION

Figure 2:
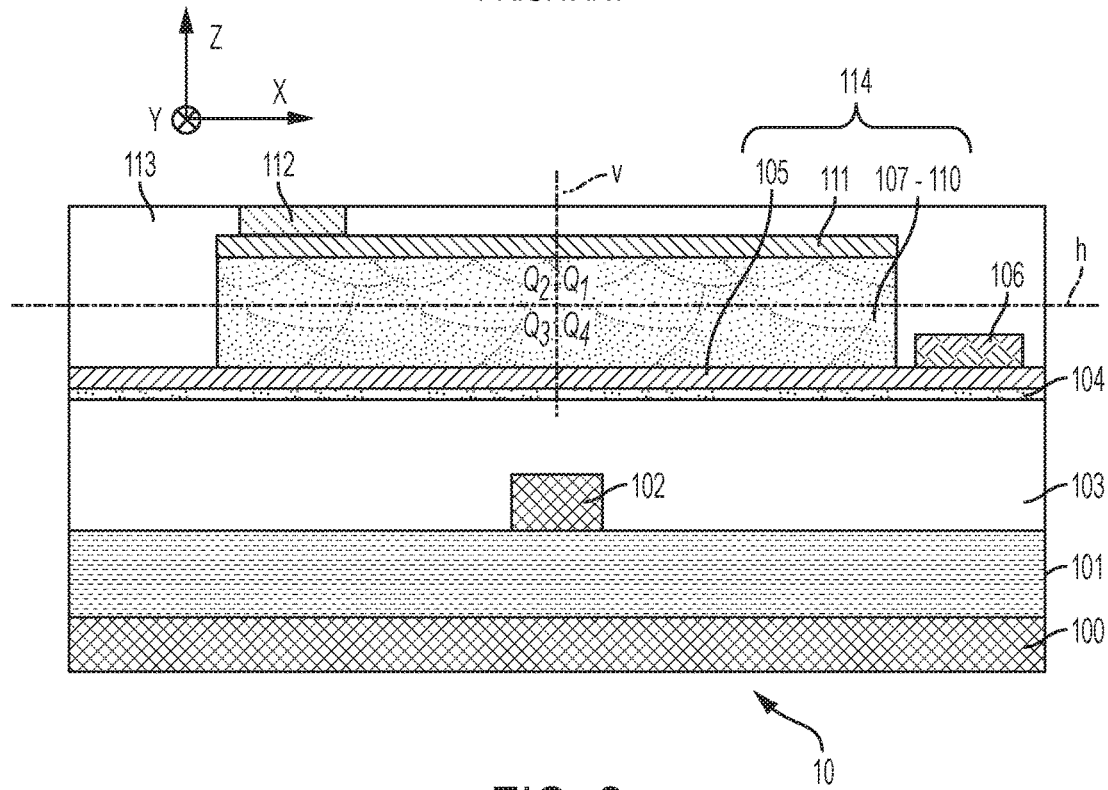
FIGS. 2-3 show, each, a 2D cross-sectional view of an electro-optical device involving an asymmetric electrode configuration, according to embodiments. Namely.
Figure 3:
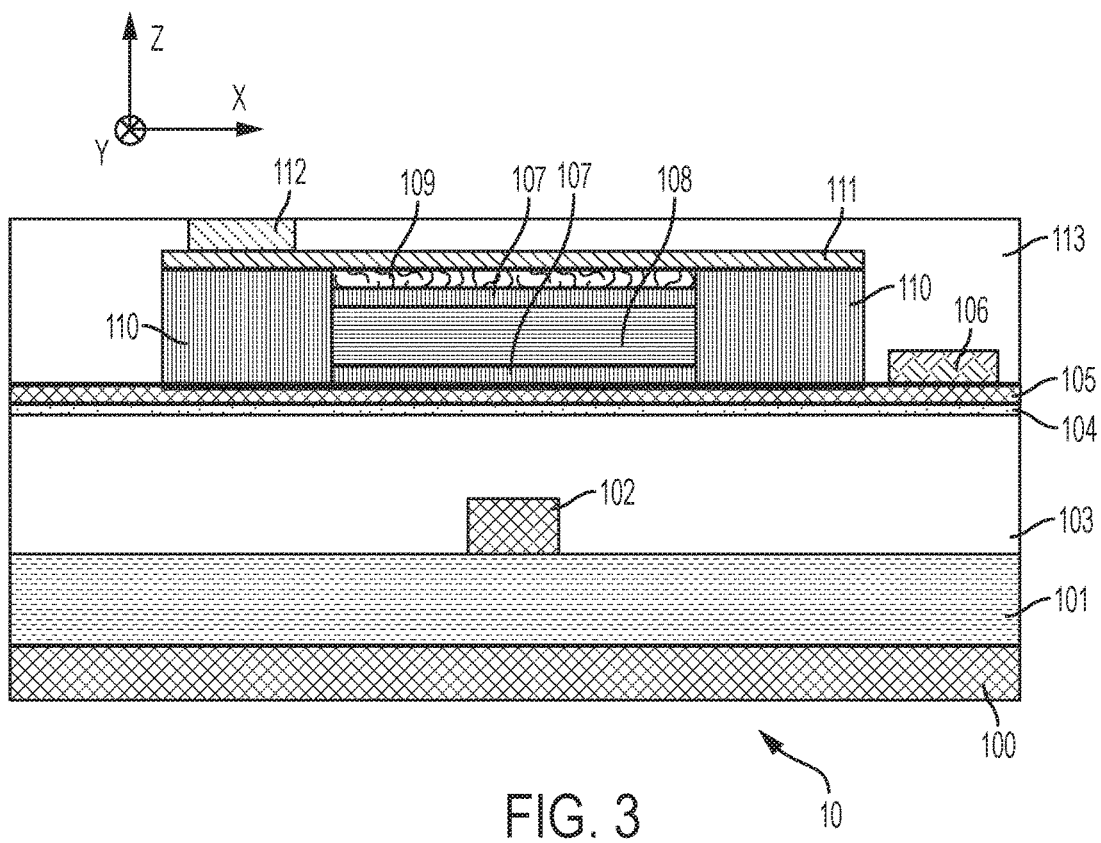

In reference to FIGS. 2-5, an aspect of the invention is first described, which concerns an electro-optical device 10. This device comprises an active component that has a layer structure 114. An exemplary embodiment of this layer structure is illustrated in FIG. 3, whereas FIG. 2 shows median planes of the structure 114, which planes are orthogonal, so as to define quarters $Q_1$-$Q_4$ having substantially the same volume in the structure 114.

Basically, the layer structure 114 comprises: an n-doped layer 105; a stack 108 of III-V semiconductor gain materials; and a p-doped layer 111. The stack 108 of III-V semiconductor gain materials is stacked along the stacking direction z, which is perpendicular to a main plane of the stack 108, see FIG. 3. The n-doped layer 105 extends essentially parallel to the main plane of the stack 108, on one side thereof (e.g., underneath the stack 108 in the example of FIGS. 2-3). The p-doped layer 111 too extends essentially parallel to the main plane of the stack 108 but on the other side of the stack.

As depicted in FIG. 2, median planes h, v can be defined in the layer structure 114. Namely, the median horizontal plane h of the layer structure 114 is perpendicular to the stacking direction z and parallel to the main plane of the stack 108, while the median vertical plane v of the layer structure 114 is parallel to the stacking direction z and perpendicular to the median horizontal plane h (and thus to the main or average plane of the stack 108 too). The two median planes h, v meet at an intersection line that extends perpendicularly to the cross-section plane of FIG. 2 (i.e., along direction y).

The median horizontal and vertical planes can for instance be compared to the axial plane and the median plane, respectively, as defined in anatomy. Note that the median horizontal plane h and the median vertical plane v are not necessary symmetry planes of the layer structure 114, although they can be. For example, comparing FIGS. 2 and 3, one understands that, in the embodiment of FIG. 3, the median vertical plane v is a symmetry plane, because the III-V stack is symmetric with respect to plane v (as in some embodiments), whereas the median horizontal plane h is not, because of layer 109, which will be described later. Still, both planes are median planes in the sense that each of them separates the layer structure 114 in halves of substantially the same volume.

As seen in FIGS. 2-5, the device further comprises two sets of ohmic contacts 106, 112. Such contacts are metal-semiconductor contacts, ensuring electrical contact between electrodes and respective layers 105, 111. The ohmic contacts are thus meant to be contacted by electrodes (not shown, for conciseness). An ohmic contact may be a small conductive pad, i.e., a small portion of material(s), or an area where an electrode contacts a respective semiconductor layer 105, 111. It may notably comprise a transition region of material between the electrode's material(s) and the layer's, e.g., the transition region formed after alloying the electrode and the semiconductor layer. Ohmic contacts are known per se. What matters here is their relative locations.

The ohmic contacts and adjoined electrodes are configured for vertical current injection in the stack 108 of III-V semiconductor gain materials. Current is thus meant to be injected vertically, i.e., along the stacking direction z and typically from the top, e.g., as in the framework assumed in the accompanying drawings. The device 10 can therefore be regarded as a vertical current injection device. The structure 114 is typically cladded, e.g., with $SiO_2$.

A first one of the sets of ohmic contacts consists of one or more n-type ohmic contacts 106, which are in contact with the n-doped layer 105, while the second set consists of one or more p-type ohmic contacts 112, in contact with the p-doped layer 111. In the examples of FIGS. 2-5, each set is assumed to comprise only one ohmic contact, for simplicity. Yet, in variants, each set may comprise two or more ohmic contacts, although this should rarely be necessary in practice.

In all cases, all the vertical current injection ohmic contacts of the device can be decomposed into two asymmetric sets, i.e., a p-type set and an n-type set of ohmic contacts. The two sets of ohmic contacts have an asymmetric configuration. Namely, as depicted in FIG. 2, the two sets 106, 112 are arranged on respective (opposite) sides of the median vertical plane v. Now, because the ohmic contacts of the two sets contact different layers 105, 111 (on respective side of the median horizontal plane h), the ohmic contacts further exhibit some asymmetry with respect to this median horizontal plane h too. Furthermore, since the contacts are asymmetric, the resulting asymmetry reflects in the electrode configuration, as the areas where such electrodes contact the layers 105, 111 are asymmetrically arranged with respect to plane v. For completeness, we note that the asymmetry of the contacts 106, 112 can in fact be defined with respect to an infinity of vertical planes passing through the structure 114.

On the contrary, in a classical electro-optical structure such as depicted as in FIG. 1, symmetric sets of ohmic contacts are provided for vertical current injection in the stack 107a. In FIG. 1, the ohmic contacts comprise two n-type ohmic contacts 106, 106a in contact with the n-doped layer 105 and two p-type ohmic contacts 112, 112a in contact with the p-doped layer 111. Thus, ohmic contacts form sets that are symmetrically arranged with respect to the median vertical plane v (ohmic contacts of each type are arranged on each side of the vertical plane).

For such a configuration, measurements and simulations performed by the inventors have led them to conclude to weak overlaps between the gain profile or recombination zone and the fundamental mode position. Now, if thin layer configuration are involved (as typically used in shallow III-V optoelectronic devices as contemplated herein), the series resistances become so high that the electric field constrains, in turn, the trajectories of charges electrons and holes. As present inventors have realized, this problem can be circumvented by using an asymmetric electrode configuration.

As a result of an asymmetric electrode configuration, the shape of the electric field changes and the recombination zone happens to better match the fundamental mode intensity profile. A drawback of the present approach, however, is that it results in an increase of the access resistances, typically by a factor of about two. It nevertheless remains that substantially higher output power and lower threshold currents can be obtained with the present approach.

In other words, using an asymmetric electrode configuration makes it possible to shape the electric field so as for it to be laterally more homogeneous, compared with an electric field as obtained with a symmetric electrode arrangement. This makes it possible for the recombination zone of electrons and holes to show improved overlap with the fundamental mode position, which, in turn, allows proper designing of balanced electron and hole injection while keeping the recombination center in the mode region.

FIG. 2 illustrates an embodiment where the ohmic contacts are asymmetrically arranged with respect to each of the two median planes h, v. I.e., here the two (sets of) ohmic contacts are, on the one hand, arranged on opposite sides of the horizontal plane h and, on the other hand, on opposite sides of the vertical plane v.

In the example of FIG. 2 or 3, the n-type ohmic contact(s) 106 is(are) entirely on one side of (e.g., underneath) the median horizontal plane h and on one side (e.g., on the right-hand side) of the median vertical plane v, whereas the p-type ohmic contact(s) is(are) entirely on the other side of (e.g., above) the median horizontal plane h and on the other side (e.g., on the left-hand side) of the median vertical plane v. In other words, the ohmic contacts are arranged in opposite quarters (or quadrants) $Q_2$, $Q_4$ formed by the median planes (i.e., in opposite quarters with respect to the intersection line of the median planes h, v).

The structural arrangement of FIGS. 2, 3 imply shallow contacts, which in turn allow shallow structures to be obtained. This eases the monolithic integration of the resulting III-V devices, e.g., on Si CMOS platforms, as discussed later.

Of course, in variants, the n- and p-layers could be interchanged, i.e., the p-doped layer may be provided as a lower layer and the n-doped layer be the upper layer, even though current could would still be injected vertically (the current going from the p- to the n-electrode.). Still, an asymmetric electrode configuration could be obtained, with, e.g., ohmic contacts arranged in opposite quarters or, at least, on respective sides of the median vertical plane.

More generally, though, the local height of the n-type layer 105 may be such (e.g. by local or selective epitaxial regrowth of a highly doped region) that the ohmic contact 106 effectively protrudes above the median horizontal plane h. In that case, the ohmic contacts 106, 112 would not be entirely located in opposite quarters. Yet, even in that case, the contact regions formed by the ohmic contacts (of either set) and their respective p-type or n-type layers 105, 111 may be located on opposite sides of the median vertical plane v, which is the true condition for the desired effect to be achieved, i.e., the electric field in the active region would still have a lateral configuration while the current would still be injected vertically. Thus, most generally, this is the arrangement of the ohmic contacts 106, 112 that must be asymmetrical, i.e., ohmic contacts 106, 112 must contact the distinct layers 105, 111 on respective sides of the median plane v, in order to obtain higher output power and lower threshold currents, as present Inventors have realized.

Figure 4:
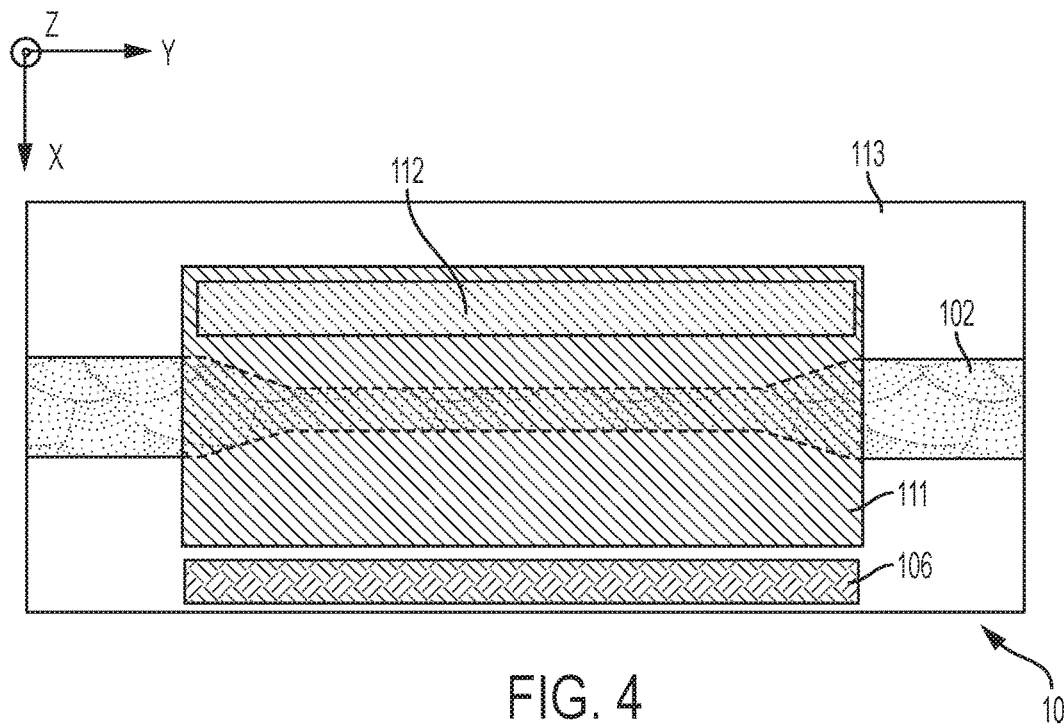
FIG. 4 shows a top view of the device of FIG. 3.
Figure 5:
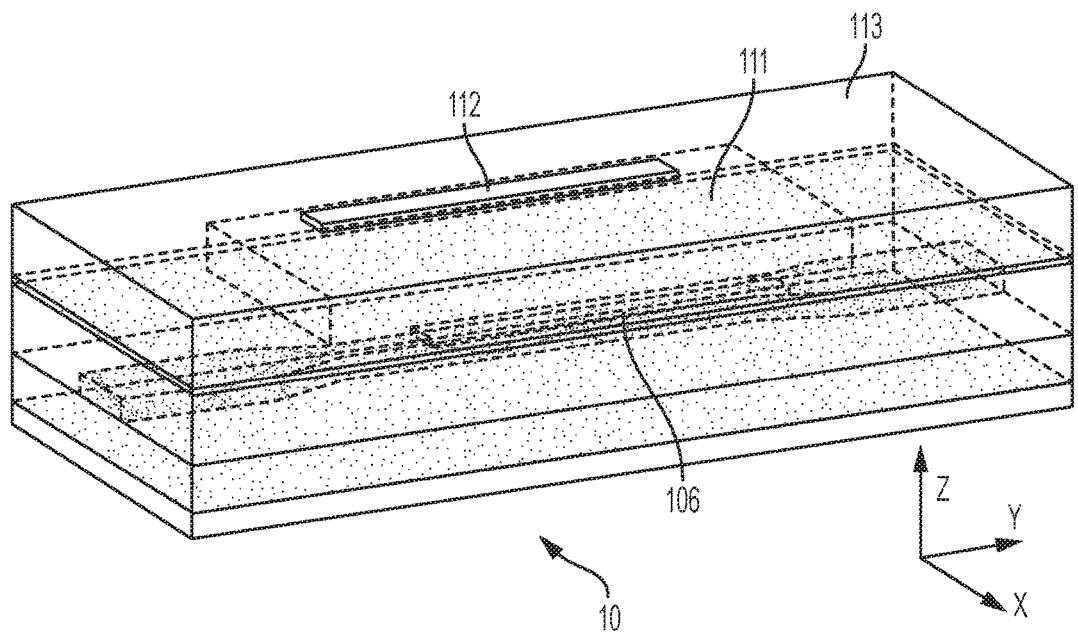
FIG. 5 is a 3D view of the same device.

In embodiments as depicted in FIG. 4 or 5, each of the two sets of ohmic contacts 106, 112 consists of one ohmic contact only. I.e., the device 10 comprises two ohmic contacts 106, 112 only, which are asymmetrically arranged. Thus, one contact 106 is on one side of the median vertical plane, the other contact 112 being on the other side. Since the two contacts 106, 112 contacts layers 105, 111 on opposite sides of the median horizontal plane h, the two contacts 106, 112 happen to be asymmetrically arranged with respect to each of the median horizontal plane h and the median vertical plane v of the layer structure 114. Indeed, and as present Inventors have realized, only two asymmetric ohmic contacts are really necessary, contrary to symmetric (or substantially symmetric) four-electrode arrangements as commonly done in the art.

Referring back to FIG. 3, in the present electro-optical devices 10, the stack 108 of III-V semiconductor gain materials can be embedded, laterally, in a current blocking layer 110. The current blocking layer 110 extends essentially parallel to the main plane of the stack 108, i.e., in the plane (x, y), parallel to the median horizontal plane h. The current blocking layer 110 typically comprises an oxide. In variants, it may have a pnpn-InP structure or a semi-insulating InP (e.g., Fe-doped) configuration.

Note that, where a current blocking layer is involved, the series resistances as typically obtained with a symmetric electrode configuration (as in FIG. 1) would likely cause the electric field to force electrons and holes to move as close as possible to this current blocking layer. Instead, an asymmetric electrode configuration as used in FIG. 3 makes it possible to shape the electric field so as for it to be laterally more homogeneous and, therefore, prevents or, at least, mitigates this problem.

In embodiments, the layer structure 114 further comprises an electron blocking layer 109. Here, the layer 109 extends parallel to the main plane of the stack 108 of III-V semiconductor gain materials, so as to separate the latter from the p-doped layer 111. An electron blocking layer is otherwise known per se. The electron blocking layer 109 may for instance comprise InAlAs.

In embodiments, the stack of III-V semiconductor gain materials further comprises two separate confinement heterostructures 107, or SCHs, as well as an active region 108, where the latter is sandwiched between said heterostructures 107. The active region 108 may for instance comprise multiple quantum well structures, as known per se.

Each of the layers 107 and 109 may be regarded as forming part of the stack of III-V semiconductor gain materials, in addition to its active component 108. Layer 110 too may also be regarded as forming part of the stack, although it does not necessarily comprise III-V semiconductor materials (it may comprise an oxide, for example). Still, layer 110 forms part of the layer structure 114.

In general, the present electro-optical devices 10 may involve a stack of III-V semiconductors that is configured as a laser, an optical detector or a semiconductor optical amplifier, or SOA. Indeed, and as the one skilled in the art will appreciate, asymmetric ohmic contacts may benefit to each of the above types of devices, inasmuch as such devices may advantageously rely on vertical current injection and involve lateral electric fields. In particular, the present devices 10 may be configured as lateral electric field, vertical current injection laser devices and, notably, as edge-emitting lasers.

The above electro-optical devices 10 may be fabricated using well-known fabrication techniques. Essentially, their fabrication only differ in that asymmetric pairs of ohmic contacts are omitted. The remaining ohmic contacts 106, 112 will typically extend over distance that corresponds to a major portion or substantially all the length of the layer structure 114 along y, as illustrated in FIG. 4. As discussed later in detail, such devices 10 may be fabricated so as to include the upper structure 105-113 only, which could later be bonded on a lower structure 100-103, e.g., via a bonding layer 104. Thus, and as seen in FIGS. 2-5, the present electro-optical devices 10 may, in embodiments, further include a cladded waveguide structure, underneath the upper structure 105-113. A further aspect of the invention therefore concerns devices 10 that include both a lower structure 100-103, which includes a waveguide core 102, and an upper structure 105-113 as described above.

As depicted in FIGS. 2-5, the cladded waveguide structure may comprises a tapered waveguide core 102, which is embedded in a cladding structure 103. The waveguide core 102 extends opposite to the stack 108 of III-V semiconductor gain materials with respect to the n-doped layer 105. The waveguide core 102 extends along a longitudinal direction (parallel to direction y) that is typically comprised in the median vertical plane v and parallel to the median horizontal plane h. Such a device is furthermore designed so as to allow radiation to be optically coupled between the stack 108 of III-V semiconductors and the tapered waveguide core 102.

The waveguide core is typically made of silicon, as assumed hereafter. The device can be designed so as to allow an adiabatic coupling between the III-V stack 108 and the tapered Si waveguide core 102. The coupling is bidirectional (or reciprocal), i.e., it occurs from the III-V stack 108 to the Si waveguide core 102 and, conversely, from the Si waveguide core to the III-V stack 108. Moreover, the present electro-optical devices 10 may advantageously be configured to allow a hybrid-mode optical coupling between an active region of the stack 108 of III-V semiconductor gain materials and the tapered waveguide core 102.

To that aim, the Si waveguide core 102 may exhibit two tapers inwardly oriented (as shown in FIGS. 4-6). In variants, the waveguide core 102 may comprise two well-separated and aligned waveguide portions, each terminated by a taper, so as for the two tapers to face each other. That is, in the latter case, the central portion of the waveguide reduces to zero, effectively leading to two aligned waveguide portions. Such a configuration may, however, be less efficient in practice, for the present purpose.

The waveguide core 102 is typically patterned from a top Si layer of a silicon-on-insulator (SOI) substrate 100-102, having a buried oxide layer 101, as assumed in FIG. 3.

The cladding structure 103 shall typically comprise $SiO_2$. However, the material of the cladding structure 103 may optionally comprise one (or more) of the following materials: SiON; $Si_xN_y$; AlN; $AlO_x$; AlON; $HfO_x$; $Ta_2O_5$; $TiO_x$; or $ZrO_x$, where this material may possibly fill a trench performed in the cladding structure 103, for reasons that will become apparent later.

For completeness, the present devices 10 may typically comprises a bonding layer 104, between the n-doped layer 105 and the cladding structure 103. The bonding layer may for instance comprise $SiO_2$ or $Al_2O_3$.

As seen in FIG. 3, the presence of a tapered waveguide core 102 does not prevent the ohmic contacts to have an asymmetric configuration, i.e., the n-type ohmic contact(s) 106 and the p-type ohmic contact(s) 112 can be asymmetrically arranged with respect to each of the median horizontal plane h and the median vertical plane v.

Figure 6A:
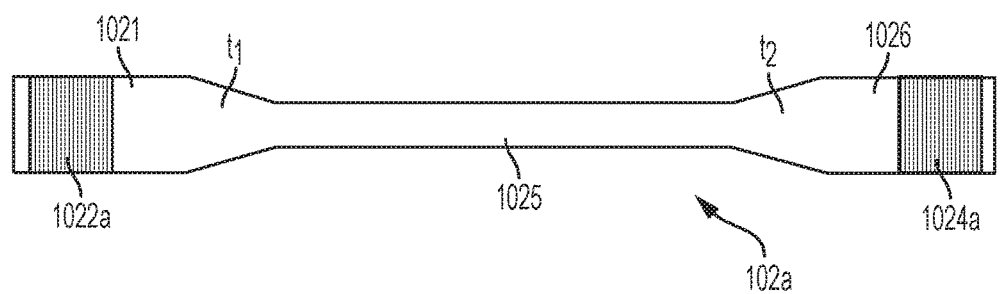
FIGS. 6A and 6B depicts possible variants to the waveguide core of the device, for achieving a distributed Bragg reflector laser (FIG. 6A) or as a distributed feedback laser (FIG. 6A)
Figure 6B:
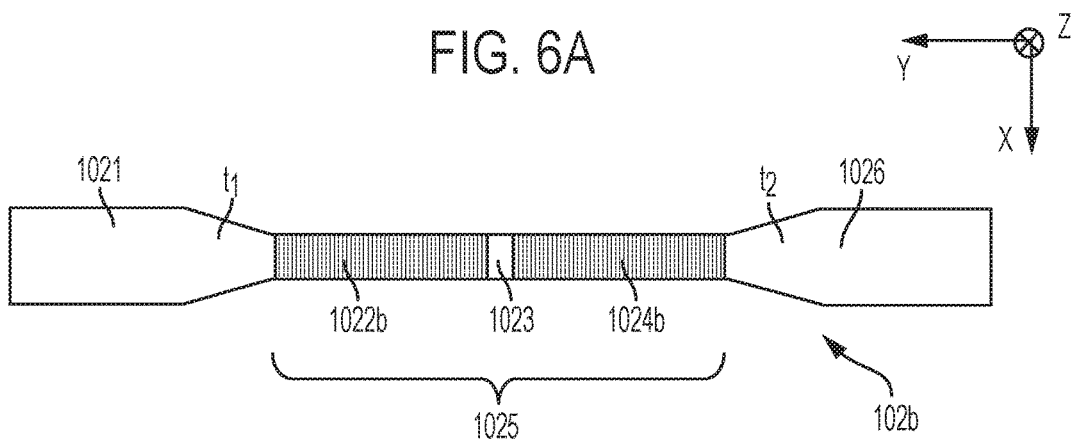

Possible configurations of the lower waveguide structure are now discussed in detail, in reference to FIGS. 6A-6B. In general, the waveguide core 102 will be structured so as to comprise: an input portion 1021; a middle portion 1025; and an output portion 1026. In addition, the core 102 comprises tapers $t_1$, $t_2$, and the middle portion 1025 is connected to each of the input portion 1021 and the output portion 1026 via a respective one of the tapers $t_1$, $t_2$. The tapers $t_1$, $t_2$ narrow inwardly toward the middle portion. The tapers $t_1$, $t_2$ and the middle portion 1025 are, altogether, located vis-à-vis the stack 108 of III-V semiconductor gain materials.

With such a structure of the waveguide, the middle portion has an effective refractive index that is smaller than the effective refractive index of any of the input portion and the output portion, which favors optical coupling between the III-V stack 108 and the Si waveguide core 102. The middle portion and the tapers are furthermore vis-à-vis the stack 108 and their extension along y matches the extension of the III-V stack, so as to prevent reflection in the III-V stack, i.e., the light (essentially) entirely couples into the Si waveguide core 102 before the III-V stack 108 ends.

In embodiments, the present electro-optical devices 10 may be configured as a distributed Bragg reflector laser. To that aim, the optical waveguide core 102 may be structured so as to comprise one or more, e.g., two, Bragg reflectors 1022a, 1024a arranged in one or each of: the input portion and the output portion, as depicted in FIG. 6A. Bragg reflectors 1022a, 1024a can be simply obtained by structuring the waveguide outermost portions 1021, 1026, as known per se.

In other embodiments, the present electro-optical devices 10 may be configured as a distributed feedback laser, thanks to an optical waveguide core 102 structured so as to comprise one or more distributed feedback reflectors 1022b, 1024b arranged in the middle portion. Distributed feedback reflectors 1022b, 1024b can again be obtained by structuring the waveguide inner portion 1025 (leaving a central portion 1023 not structured), e.g., so as to make up a quarter-wavelength shifted distributed feedback cavity, as depicted in FIG. 6B.

Referring back to FIGS. 2-5 altogether, shallow III-V stacks can be utilized for the present purpose, so as allow a monolithic integration of III-V optoelectronic devices on Si Complementary Metal Oxide Semiconductor (CMOS) platforms. To that aim, the present electro-optical devices 10 can comprise a layer structure 114 that has a form factor, i.e., the average, in-plane dimension of the layer structure 114 (as measured in the median horizontal plane h) is therefore substantially larger than the average, out-of-plane dimension of the layer structure 114 (as measured in the median vertical plane v).

Such stacks 108 can therefore be less than 500 nm thick. For instance, the average thickness of the stack 108 of III-V semiconductor gain materials may be between 50 nm and 400 nm (this thickness is measured along z in the appended drawings). This average thickness may even be between 220 nm and 280 nm.

As said earlier, the layer structure 114 can be configured to optically couple radiation between the stack 108 of III-V semiconductors and the tapered Si waveguide core 102. Furthermore, the cladding structure 103 may comprise a material (arranged between the n-doped layer 105 and the tapered waveguide core 102) selected so as to have a refractive index that is larger than 1.54 for such radiation. Moreover, this material has a bandgap, which, in energy units, is larger than an average energy of said radiation, in operation.

As it can be realized, the value of 1.54 imposes a higher refractive index than that of $SiO_2$ for the wavelengths of interest. The wavelength range of interest is in the optical range (i.e., 100 nm-1 mm, according to DIN 5031) and the terminology "radiation" as used herein refers to electromagnetic radiation in the wavelength range between 100 nm and 1 mm. However, the wavelength range will, in most applications, be between 200 nm and 7.5 μm. In particular, wavelengths of 1.3 and 1.55 μm are typically contemplated (and possibly 980 nm).

Using a higher refractive index material 103 allows less constraints in the design rules of the device as such a material allows larger physical gaps between the III-V stack 108 and the Si waveguide core 102. This, in turn, makes it possible to ease integration of the electro-optical device 10, e.g., in CMOS integrated circuits.

In particular, thanks to a higher refractive index material 103, the optical coupling obtained between the Si waveguide core 102 and the III-V gain region 108 makes it particularly interesting for the integration of, e.g., low threshold lasers, tunable lasers, and other photonic integrated circuits with CMOS integrated circuits.

As said, the waveguide core 102 can be configured to enable adiabatic coupling with the III-V stack 105. Adiabatic optical coupling is known per se. Adiabaticity is considered to be reached when the optical distribution is defined by the same eigenmode (i.e., supermode) of the coupled system throughout the contact, with minimal scattering to other supermodes or radiation modes. Adiabaticity, however, is a relative term; a coupler is considered to be adiabatic when the optical loss is below a predefined level, e.g. less than 15% or typically less than 10%. In that respect, the tapered portions of the waveguide 102 may be designed to have a slope that optimizes the optical coupling, while minimizing the optical coupling between the outer (wide) waveguide portions. The length of the taper portions shall typically be between 10 μm and 10 mm, which range of lengths allow for exceeding adiabaticity limits, in practice.

In practice, suitable materials 103 will have a refractive index that is larger than 1.7 (for the radiations of interest). In addition, such materials 103 can have a refractive index that is less than 2.4 for such radiations. Thus, suitable materials may typically have a refractive index that is between 1.7 and 2.4, for the radiations of interest.

In particular, the present electro-optical devices 10 may comprise a material 103 that comprises one or more of the following materials: SiON, $Si_xN_y$, AlN, $AlO_x$, AlON, $HfO_x$, $Ta_2O_5$, $TiO_x$, and $ZrO_x$. Although several of these materials may, in principle, be involved, one can uses a same material, selected from the above list, be it to simplify the fabrication process.

In embodiments, the present electro-optical devices 10 are structurally designed such that a minimal distance between a lower layer of the stack 108 of III-V semiconductor gain materials and the tapered Si waveguide core 102 may reach 1000 nm. More generally though, this distance may typically be between 10 and 1000 nm (this distance is measured along axis z in the appended drawings). More flexibility is obtained in the structural design of the present devices, thanks to a higher refractive index material 103, such that the gap between the III-V stack and the Si waveguide core does not be confined to small distance (~300 nm) as when using SiO$_2$ as a separation layer. The minimal distance can be between 300 and 800 nm and more specifically can be between 400 and 600 nm.

Figure 7:
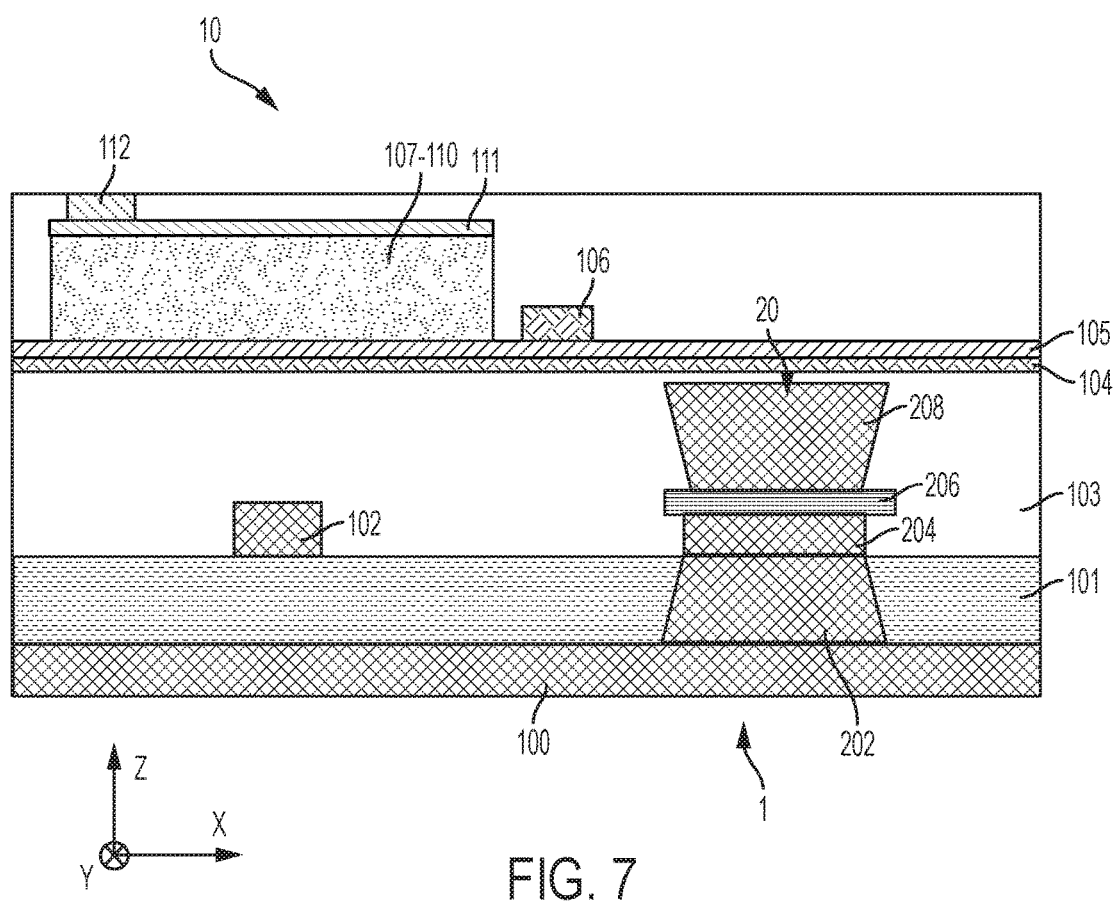
FIG. 7 is a 2D cross-sectional view of an optoelectronic device comprising an electro-optical device as in FIG. 3 and, co-integrated therewith, a heterostructure bipolar transistor, as in embodiments.

Referring now to FIG. 7: another aspect of the invention concerns an optoelectronic device 1. Most generally, this device 1 comprises an electro-optical device 10 as described above in reference to FIGS. 2-5.

In addition, the optoelectronic device 1 may comprise an integrated circuit component 20 (or IC for short), which is integrated with the electro-optical device 10. The IC devices 10, 20 can be integrated as a Si CMOS integrated circuit.

In embodiments, the IC 20 may be regarded as being monolithically integrated with the electro-optical device 10. In the literature, however, the terminology "monolithically integrated laser" often involves heteroepitaxy on silicon. Lasers, integrated through a bonding process as contemplated in embodiments herein are mostly referred to as heterogeneously integrated. Yet, beside the bonding process, remaining steps of the fabrication process will typically be similar to a monolithic integration. Accordingly, present embodiments allow a platform to be obtained, which integrates III-V devices into a CMOS fabrication process.

In embodiments, the IC 20 is integrated with the electro-optical device 10 on the same lower Si substrate 100 that otherwise supports the device 10, as assumed in FIG. 7. That is, a same substrate 100 may be used that supports each of the devices 10, 20. However, in variant, the bonding may be performed on top of the devices 10, 20, e.g., after planarization, such that wafer bonding is possible, based on distinct substrates.

In embodiments, the optoelectronic device 1 is a BiCMOS device and the IC 20 comprises a hetero structure bipolar transistor, or HBT, as in FIG. 7. I.e., the device 1 integrates two separate semiconductor technologies (bipolar transistors and CMOS circuits) in a single integrated circuit device. The HBT may notably be supported on the same Si substrate 100 as used for the device 10, as evoked just above. More generally though, the HBT 20 may be co-integrated as a mere CMOS IC or a Bipolar IC.

In the embodiment of FIG. 7, the material 103 may be SiO$_2$ or it may comprise a higher refractive index material, e.g., laterally embedded in a lower refractive index medium such as SiO$_2$. The HBT 20 comprises a selective Si epitaxy layer 202 and, in addition, a Si collector 204, a silicon-germanium base 206 (Si$_x$Ge$_{1-x}$, with 0≤x≤1) and a Si emitter 208, where each of the components 204-208 is embedded in the cladding material 103. Not all components of the HBT 20 are depicted, for clarity. In particular, contacts of the HBT 20 are not shown.

At present, some fabrication methods are briefly discussed. Essentially, such fabrication methods involve the following fabrication steps:

An initial SOI substrate is provided, which includes an oxide layer 101 buried therein. As usual, the initial SOI substrate comprises a lower Si layer 100, which can be regarded as a substrate of its own, and a top Si layer, located on top of the buried oxide layer 101. A tapered Si waveguide core 102 is structured from the top Si layer. A cladding material 103 is deposited, so as to obtain a first cladding structure.

The bonding layer can be deposited on top of the first cladding structure 103. The stack 107-109 of III-V semiconductor gain materials is sited on the bonding layer and cladded to obtain a second cladding structure 113. The III-V stack can make up a full wafer and is structured after bonding. In variants, the III-V stack can be bonded after having been structured.

Fabrication methods can further comprise a step of cladding the tapered Si waveguide core 102 with a medium covering the buried oxide layer 101, at least partly. A trench is opened (not shown) in the previously deposited medium, at the level of the Si waveguide 102, so as to leave lateral, residual portions of the deposited medium on top of the buried oxide layer 101. A higher refractive index material is deposited so as to fill the trench.

The higher refractive index material may notably be deposited by physical vapor deposition (PVD), chemical vapor deposition (CVD), hybrid physical-chemical vapor deposition (HPCVD), or atomic layer deposition (ALD).

The fabrication methods can further comprise, after having deposited the higher refractive index material, a step of polishing the deposited material for it to be level with the lateral, residual portions of the medium as initially deposited, e.g., using chemical-mechanical polishing techniques.

In the specific embodiment of FIG. 7, each of the additional components 202, 204 and 208 are grown by selective epitaxy or, in variants, are deposited as polysilicon. The component 202 can be deposited after opening a trench in the buried oxide layer 101. The other components 204-208 are deposited before cladding with, e.g., SiO$_2$. Later on, another trench can be opened to deposit a higher refractive index material, if needed.

Some of the method described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications to advanced computer products.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, other materials than those explicitly listed in respect of layers 100-113 could be used, to obtain devices functionally similar to those as described hereinbefore.

What is claimed is:

1. An electro-optical device having a layer structure comprising:

a stack of III-V semiconductor gain materials stacked along a stacking direction z perpendicular to a main plane of the stack, wherein the stack of III-V semiconductor gain materials is laterally embedded in a current blocking layer comprising a semi-insulating InP configuration, the latter extending essentially parallel to the main plane of the stack;

an n-doped layer extending essentially parallel to said main plane, on one side thereof;

a p-doped layer extending essentially parallel to said main plane, on another side thereof; and a tapered waveguide core embedded in a cladding structure, the waveguide core extending opposite to the stack of III-V semiconductor gain materials with respect to the n-doped layer, along a longitudinal direction comprised in the median vertical plane and parallel to the main plane of the stack, wherein the tapered waveguide core is configured to enable adiabatic coupling between the stack of III-V semiconductor gain materials and the tapered waveguide core, wherein a median vertical plane of the layer structure is parallel to said stacking direction z, and perpendicular to said main plane of the stack, and through the middle of the stack;

wherein the device further comprises two sets of ohmic contacts configured for vertical current injection in the stack of III-V semiconductor gain materials, the two sets consisting of: a first set of one or more n-type ohmic contacts in contact with the n-doped layer; and a second set of one or more p-type ohmic contacts only in contact with the p-doped layer, one of the p-type ohmic contacts disposed on and overlapping with the current blocking layer in said stacking direction z, the first set being arranged on a first side of said median vertical plane and the second set being arranged on a second side of said median vertical plane with no additional n-type ohmic contacts on the second side of said median vertical plan and no additional p-type ohmic contacts on the first side of said median vertical plane.

2. The electro-optical device according to claim 1, wherein:

said sets of ohmic contacts are furthermore on respective sides of a median horizontal plane of the layer structure, which said median horizontal plane is perpendicular to each of said stacking direction z and said median vertical plane.

3. The electro-optical device according to claim 1, wherein:

each of the two sets of ohmic contacts consists of one ohmic contact only, wherein the device comprises two ohmic contacts arranged on respective sides of said median vertical plane.

4. The electro-optical device according to claim 1, wherein:

said layer structure further comprises an electron blocking layer extending parallel to the main plane of the stack of III-V semiconductor gain materials, so as to separate the latter from the p-doped layer.

5. The electro-optical device according to claim 1, wherein:

the stack of III-V semiconductor gain materials comprises two separate confinement heterostructures and an active region sandwiched between said heterostructures.

6. The electro-optical device according to claim 1, wherein:

said stack of III-V semiconductor gain materials is configured as one of:
a laser;
an optical detector; and
a semiconductor optical amplifier (SOA).

7. The electro-optical device according to claim 6, wherein:

said device is configured as a lateral electric field, vertical current injection laser device.

8. The electro-optical device according to claim 7, wherein:

said device is configured as an edge-emitting laser.

9. The electro-optical device according to claim 1, wherein:

the device is configured to allow a hybrid-mode optical coupling between an active region of the stack of III-V semiconductor gain materials and the tapered waveguide core.

10. The electro-optical device according to claim 1, wherein: said layer structure has a form factor, whereby an average dimension of the layer structure in a median horizontal plane of the layer structure is substantially larger than an average dimension of the layer structure in said median vertical plane, the median horizontal plane being perpendicular to each of the stacking direction z and the median vertical plane.

11. An electro-optical device, having a layer structure comprising:

a stack of III-V semiconductor gain materials stacked along a stacking direction z that is perpendicular to a main plane of the stack, wherein the stack of III-V semiconductor gain materials is laterally embedded in a current blocking layer comprising a semi-insulating InP configuration, the latter extending essentially parallel to the main plane of the stack;

an n-doped layer extending essentially parallel to said main plane, on one side thereof; and a p-doped layer extending essentially parallel to said main plane, on another side thereof;

wherein a median vertical plane of the layer structure is parallel to said stacking direction z, perpendicular to said main plane of the stack, and through the middle of the layer structure;

wherein the device further comprises a tapered waveguide core embedded in a cladding structure, the waveguide core extending essentially perpendicular to said direction z, opposite and parallel to the stack of III-V semiconductor gain materials with respect to the n-doped layer, the tapered waveguide core being configured to adiabatically couple radiation between the stack of III-V semiconductor gain materials and the tapered waveguide core;

wherein the device further comprises two sets of ohmic contacts configured for vertical current injection in the stack of III-V semiconductor gain materials, the two sets consisting of: a first set of one or more n-type ohmic contacts in contact with the n-doped layer; and a second set of one or more p-type ohmic contacts only in contact with the p-doped layer, one of the p-type ohmic contacts disposed on and overlapping with the current blocking layer in said stacking direction z, the first set being arranged on a first side of said median vertical plane and the second set being arranged on a second side of said median vertical plane with no additional n-type ohmic contacts on the second side of said median vertical plan and no additional p-type ohmic contacts on the first side of said median vertical plane.

12. The electro-optical device according to claim 11, wherein:

the waveguide core is structured so as to comprise: an input portion; a middle portion; an output portion; and tapers, the middle portion connected to the input portion and the output portion via the tapers, the latter narrowing inwardly toward the middle portion, the tapers and the middle portion being, altogether, vis-à-vis the stack of III-V semiconductor gain materials.

13. The electro-optical device according to claim 12, wherein:

said device is configured as a distributed Bragg reflector laser, the optical waveguide core structured so as to comprise one or more Bragg reflectors arranged in one or each of: the input portion and the output portion.

14. The electro-optical device according to claim 12, wherein:

said device is configured as a distributed feedback laser, the optical waveguide core being structured so as to comprise one or more distributed feedback reflectors arranged in said middle portion.

15. The electro-optical device according to claim 14, wherein:

an average thickness of said stack of III-V semiconductor gain materials is between 50 nm and 400 nm.

16. The electro-optical device according to claim 14, wherein:

said average thickness of the stack is between 220 nm and 280 nm.

17. The electro-optical device according to claim 11, wherein:

the tapered waveguide core comprises silicon and the cladding structure comprises a material arranged between the n-doped layer and the tapered waveguide core, said material having a refractive index that is larger than 1.54 for said radiation and a bandgap, which, in energy units, is larger than an average energy of said radiation.

18. The electro-optical device according to claim 16, wherein:

a minimal distance between a lower layer of said stack of III-V semiconductor gain materials and each of the tapered silicon waveguide is between 10 and 1000 nm.

19. The electro-optical device according to claim 17, wherein said minimal distance is between 300 and 800 nm.

20. The electro-optical device according to claim 17, wherein said minimal distance is between 400 and 600 nm.

21. The optoelectronic device according to claim 20, wherein the optoelectronic device further comprises an integrated circuit, or IC, monolithically integrated with said electro-optical device, as a complementary metal oxide semiconductor integrated circuit, or CMOS IC.

22. The optoelectronic device according to claim 21, wherein said optoelectronic device is a BiCMOS device and said integrated circuit comprises a heterostructure bipolar transistor.

* * * * *